US006817092B2

(12) United States Patent
Custer et al.

(10) Patent No.: US 6,817,092 B2
(45) Date of Patent: Nov. 16, 2004

(54) METHOD FOR ASSEMBLING A CIRCUIT BOARD APPARATUS WITH PIN CONNECTORS

(75) Inventors: James Keith Custer, Fair Oaks, CA (US); James Hiram Roberson, Placerville, CA (US); William Kerr Veitschegger, Folsom, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 272 days.

(21) Appl. No.: 09/972,697

(22) Filed: Oct. 4, 2001

(65) Prior Publication Data

US 2002/0016096 A1 Feb. 7, 2002

Related U.S. Application Data

(62) Division of application No. 09/434,682, filed on Nov. 5, 1999, now abandoned.

(51) Int. Cl.$^7$ .............................................. H01R 9/06
(52) U.S. Cl. .......................... 29/843; 29/840; 29/842; 29/837; 29/851; 228/180.1; 228/179.1; 361/803; 439/83
(58) Field of Search ........................ 29/843, 840, 842, 29/837, 851, 876; 174/255, 267, 263, 268; 439/83, 82, 591; 361/804, 790; 228/180.1, 179.1

(56) References Cited

U.S. PATENT DOCUMENTS

| 5,418,691 A | * | 5/1995 | Tokura ...................... 361/803 |
| 5,607,313 A | * | 3/1997 | Nyman ....................... 439/83 |
| 6,166,615 A | * | 12/2000 | Winslow et al. ............ 333/260 |
| 6,223,973 B1 | * | 5/2001 | Wong et al. .............. 228/180.1 |
| 2002/0016096 A1 | * | 2/2002 | Custer et al. ................ 439/83 |

* cited by examiner

*Primary Examiner*—Minh Trinh
(74) *Attorney, Agent, or Firm*—Myers Dawes Andras & Sherman, LLP

(57) ABSTRACT

A method allowing for the inexpensive automated construction of interconnections between circuit boards is provided. According to the present invention, printed circuit pins are inserted in a circuit board from the top (component side). Provided the heads of the pins are thin enough to lie beneath a solder stencil, the pins may be pre-installed on the circuit board and solder applied to the pins at the same time solder is applied to other regions of the board. Thus, known surface mount techniques may be employed to form solder connections between the pins and conductive traces on the circuit board, which facilitates the automation of the previously manual operation of soldering the printed circuit pins separately.

5 Claims, 6 Drawing Sheets

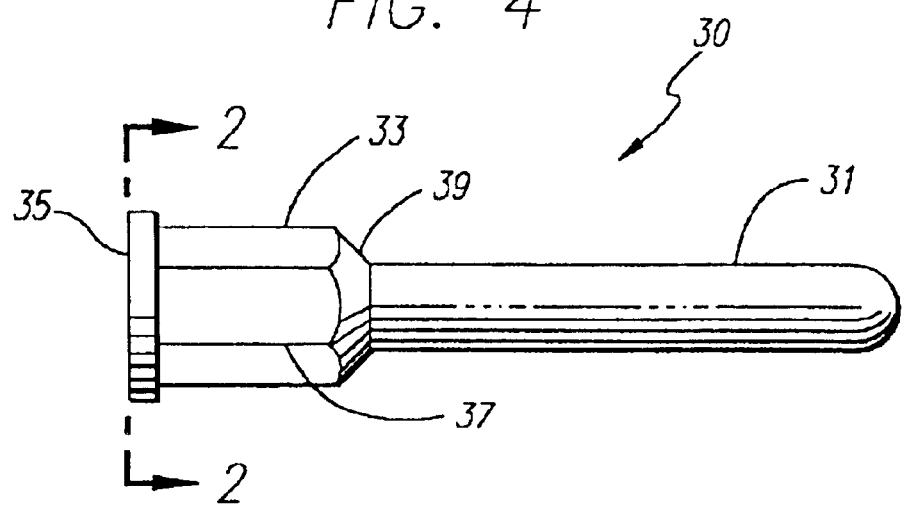
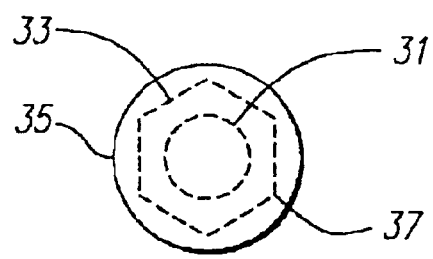
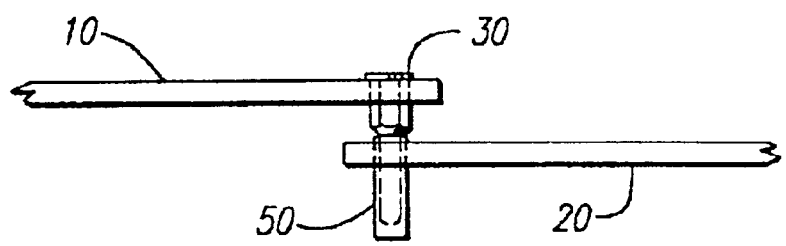

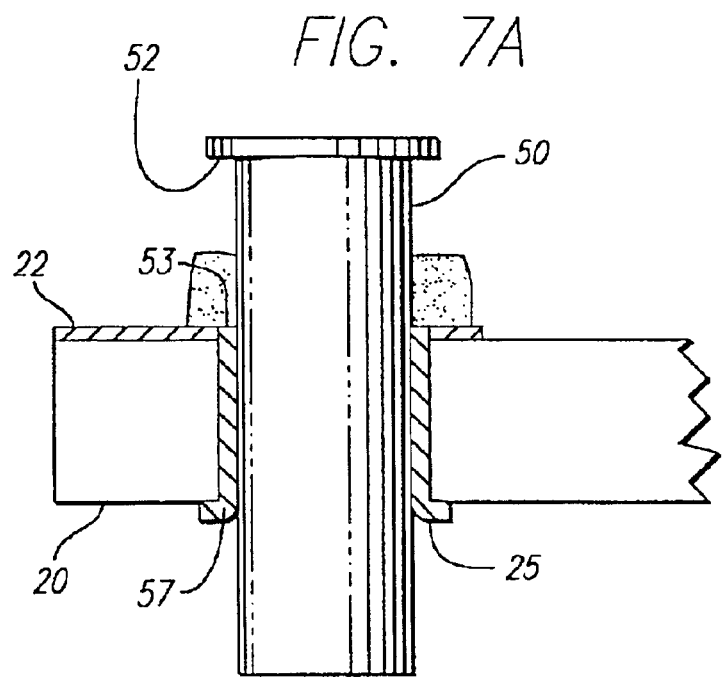
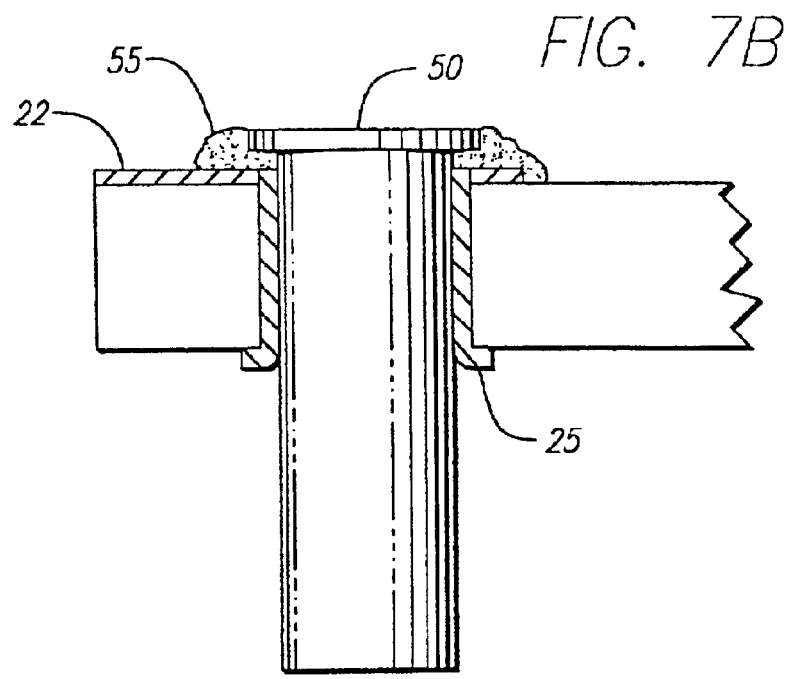

METHOD FOR ASSEMBLING A CIRCUIT BOARD APPARATUS WITH PIN CONNECTORS

1. RELATED APPLICATION INFORMATION

The present application is a divisional application of U.S. Ser. No. 09/434,682 filed Nov. 5, 1999, now abandoned.

BACKGROUND OF THE INVENTION

1. Field of the Invention

The present invention relates to interconnections for propagating radio frequency (RF) signals between circuit boards. More particularly, the present invention relates to a method for using surface-mount techniques to mount and solder connectors suitable for transmitting RF signals between two circuit boards.

2. Description of Related Art

Modern electronic circuits utilize components that operate in the RF domain. It is often necessary to transmit RF signals between two different circuit boards. For example, one may desire to couple the signal from a coplanar waveguide on one circuit board to a coplanar waveguide on another circuit board.

A coplanar waveguide is a type of high-frequency transmission line formed by placing a central conductor, i.e. a circuit trace, on the surface of one side of a circuit board, between two closely-spaced circuit traces held at ground potential. Additionally, a ground plane is placed on the reverse side of circuit board (opposite the central conductor), in which case the structure then becomes a coplanar waveguide with ground. A coplanar waveguide is a substantially planar analogue of a coaxial cable that has been sliced along its longitudinal axis to reveal a central conductor surrounded by a grounded conductive sheath.

In order to transmit a signal between coplanar waveguides on two different circuit boards, an interconnection must be provided between the respective central conductors and ground planes on each board. Care must be taken to keep the central conductor path well-shielded to minimize signal attenuation due to radiation of energy into the air. The design of an interconnection must also minimize reflections, another source of signal attenuation. The problems of radiation and reflection are general matters of concern in the design of RF transmission lines, of which coplanar waveguides are just one type.

Coaxial contacts, such as blind mate connector systems, have been used conventionally to provide an RF path between separate circuit boards or assemblies. However, the blind mate connector systems are bulky and expensive, and thus increase the cost per connection. They also require a manual operation to connect and disconnect them, further increasing the cost of their use.

Short metal ribbon interconnections have also been used. The metal ribbon interconnections are difficult to handle due to their small size. They also have a further disadvantage of requiring solder applications, often done manually, to complete the RF path. These disadvantages greatly increase the cost of completing each connection. Furthermore, metal ribbon interconnections cannot be easily disassembled. When one desires to disconnect two boards, the metal ribbon interconnections must be unsoldered.

A printed circuit pin and spring socket system has been used conventionally as a connection system for circuit boards for low-frequency analog, digital and power applications in electronics. A disadvantage of this system is that the pin connector is installed from beneath (i.e., opposite the component side) a circuit board and soldered in place by hand. Automated installation from the side opposite the component side requires complicated and expensive assembly equipment.

Accordingly, there is a need for an inexpensive method for installing a low-cost RF interconnection for providing a low-radiation, low-reflection RF path between multiple circuit boards or assemblies. There is also a need for an interconnection that may be installed, connected, and disconnected without manual operations.

SUMMARY OF THE INVENTION

In accordance with the teachings of this invention, a method for forming an RF interconnection between circuit boards using pin and socket connectors is provided. As described in more detail below, the present invention provides several distinct advantages over conventional methods of forming RF connections between circuit boards. According to the present invention, printed circuit pins are inserted in a circuit board from the top (component side), which is a step that is easily automated. Another advantage provided by having the pins inserted from the top side of the circuit board is that it is possible to use surface mount techniques to form solder connections between the pins and conductive traces on the circuit board. Provided the heads of the pins are thin enough to lie beneath a solder stencil, the pins may be pre-installed on the circuit board and solder applied to the pins at the same time solder is applied to other regions of the board. This eliminates the conventional manual soldering operations that are usually performed after other components have already been soldered in place. Reducing the conventional two-step, partially manual soldering routine to a single automated step provides a significant advantage of manufacturing efficiency.

The printed circuit pins used in connection with the present invention include a shaft located at the distal end of the printed circuit pin and a head at the proximal end. The shaft has a cylindrical cross-section and is dimensioned to be inserted through a conductively plated bore through a circuit board and into a socket connector. The head is wider than the plated bore through the circuit board. Thus, the head prevents the printed circuit pin from passing completely though the bore when the pin is inserted. The shaft and head are joined by a friction segment and taper region which form the intermediate portion of the printed circuit pin. The friction segment is dimensioned to fit snugly in the plated bore through the circuit board. The friction segment thus provides an interference fit through friction between the printed circuit pin and the plated bore through the PC board.

The assembly method includes a step of inserting the printed circuit pin in a bore through a circuit board. The insertion may be done by machine. The interference fit described above keeps the printed circuit pin in position while succeeding steps involving known surface mount techniques are applied to the circuit board. A solder stencil is laid over the circuit board after pins are inserted. Solder paste is applied to the solder stencil which contains several apertures through which solder paste is coated on regions of the circuit board lying beneath the apertures. Specifically, there are some apertures lying over the heads of the printed circuit pins, and the pins are consequently coated with solder paste. The solder paste is then heated and reflowed, and next cooled to complete the electrical connection between the printed circuit pin and a conductive surface surrounding the bore through the circuit board.

On another circuit board, solder paste is applied to regions surrounding bores through the circuit board. Socket connectors are then inserted through the bores. The solder paste is heated and reflowed, and then cooled to complete the electrical connection between sockets and a conductive surface surrounding the bores through the circuit board.

Once the pins and sockets are installed on their respective circuit boards, the interconnection is completed by mating the pins with the sockets. The result is a low-radiation, low-reflection RF path between the circuit board wherein the interconnection is integrally a part of the circuit boards.

A more complete understanding of the invention will be afforded to those skilled in the art, as well as a realization of additional advantages and objects thereof, by a consideration of the following detailed description of the preferred embodiment. Reference will be made to the appended sheet of drawings which will first be described briefly.

BRIEF DESCRIPTION OF THE DRAWINGS

FIG. 2 depicts a side view of a completed interconnection;

FIG. 4 depicts a perspective view of a printed circuit pin which may be used in connection with the present invention;

FIG. 5 depicts a view of the printed circuit pin taken along line 2—2 of FIG. 4;

FIG. 7A depicts a side view of a socket contact partially inserted in a bore through a PC board with solder paste applied to the PC board adjacent to the bore;

FIG. 7B depicts a side view of a socket contact fully inserted in a bore through a PC board after solder paste has been heated and reflowed;

DETAILED DESCRIPTION OF THE INVENTION

The present invention satisfies the need for a method for forming an inexpensive interconnection providing an RF path between for multiple circuit boards or assemblies. The present invention also satisfies the need for an interconnection that may be installed, connected, and disconnected without manual operations. In the detailed description that follows, it should be appreciated that like element numerals are used to describe like elements illustrated in one or more of the figures.

Figure 1C:
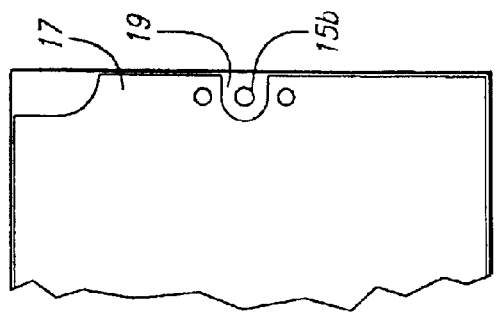
FIG. 1C depicts a view of the conductive regions plated on the bottom surface of a circuit board in relation to a conductively plated bore.
Figure 1B:
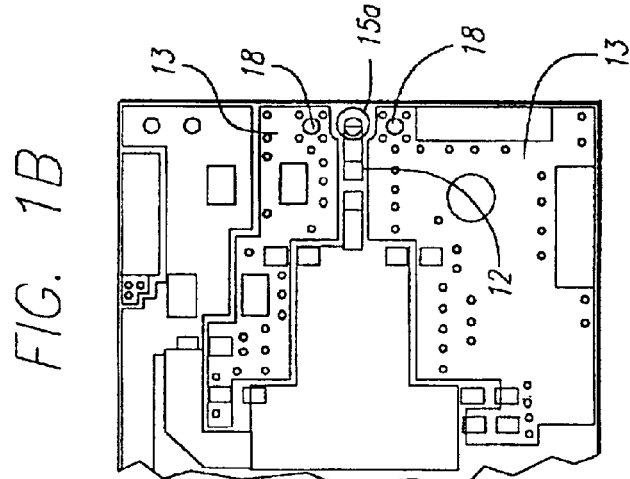
FIG. 1B depicts view of conductive regions plated on the top, component-side surface of a circuit board in relation to a conductively plated bore.
Figure 1A:
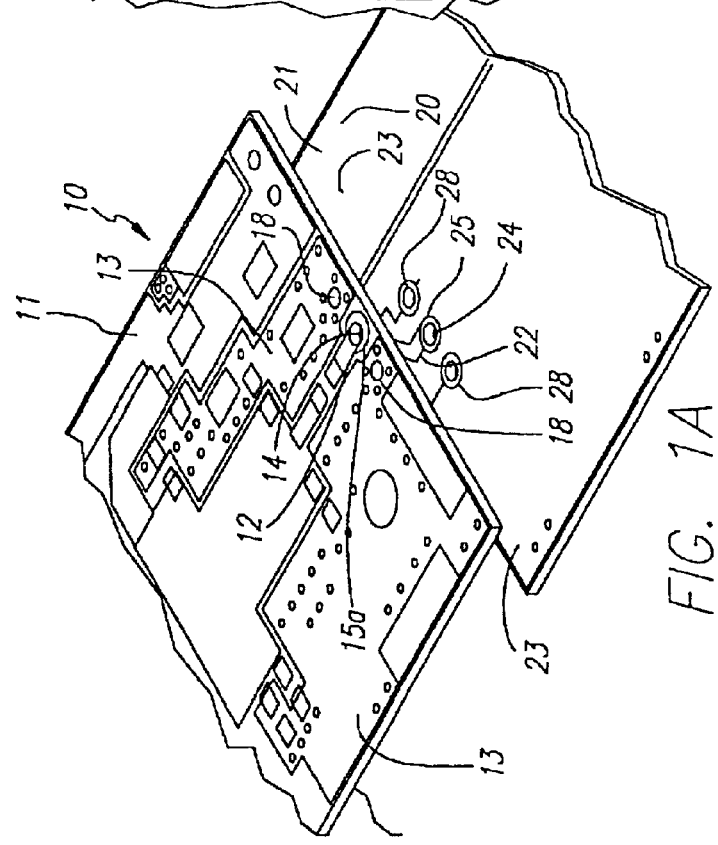
FIG. 1A depicts a perspective view of two circuit boards having RF conductive traces on the surface thereof and corresponding bores through which printed circuit pins sockets may be inserted for forming an interconnection.

Referring now to FIGS. 1A–C, a first circuit board 10 is shown. A first RF conductive trace 12 is disposed on a component-side surface 11 of the circuit board 10. The conductive trace 12 lies between two electrical ground regions 13 formed from conductive traces disposed on a component-side surface 11 of the circuit board 10. Additionally, an electrical ground plane 17 is disposed on the side of the circuit board 10 opposite the component-side surface 11. It is well known in the art that an RF signal may be propagated along the RF conductive trace 12. A second circuit board 20 is also shown with an RF conductive trace 22 and electrical ground regions 23 formed from conductive traces disposed on a component-side surface 21 of the second circuit board 20.

The circuit boards 10, 20 have conductively plated bores 14, 24 through them. The conductive plating 15, 25 lining the bores 14, 24 is electrically connected to the RF conductive traces 12, 22 on the circuit boards 10, 20. As illustrated in FIGS. 1B and 1C, the conductive plating 15 may have an component-side extremity 15a that is in electrical contact with the first RF conductive trace 12. The electrical contact between the conductive plating 15 and the RF conductive trace 12 allows an RF signal to propagate along the RF conductive trace 12 and through the circuit board 10 via the conductive plating 15. For applications using a coplanar waveguide with ground, the opposite extremity 15b of the conductive plating 15 is isolated from the ground plane 17 by a surrounding insulation region 19. The insulation region 19 prevents the RF signal from being shorted to ground. The second circuit board 20 is similarly constructed. The circuit boards 10, 20 also may have additional conductively plated bores 18, 28.

Referring now to FIG. 2, a completed interconnection is depicted. A printed circuit pin 30 is shown inserted from the component side through circuit board 10 and into socket 50 which has been inserted through circuit board 20. The pin 30 and socket 50 pass through and are in electrical contact with the plated bores as discussed in connection with FIGS. 1A–C.

Figure 3A:
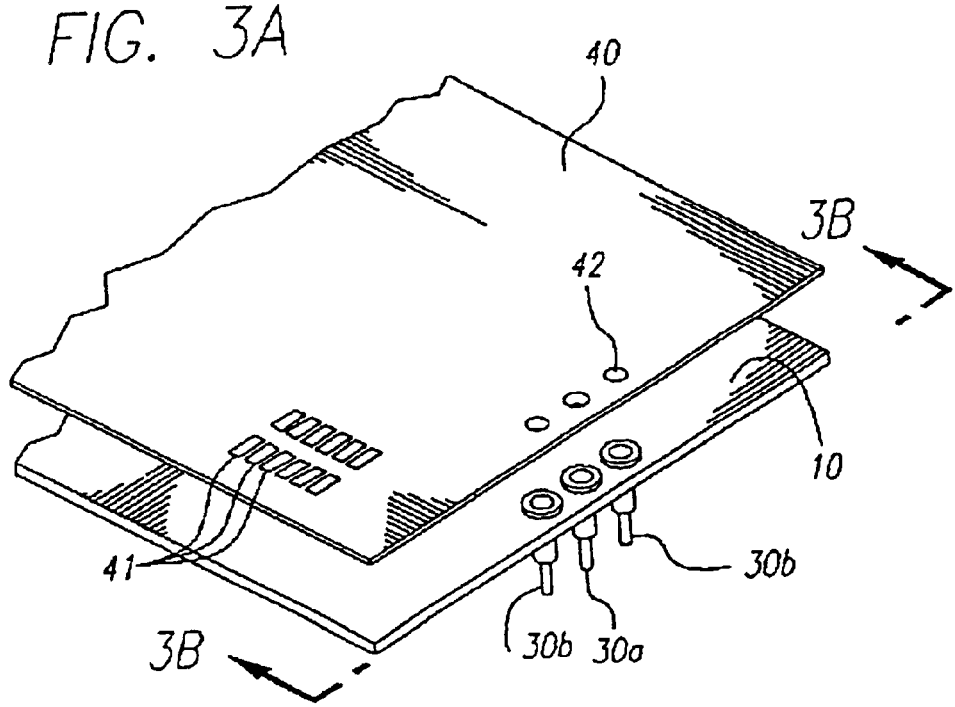
FIG. 3A depict a perspective view of a solder stencil overlaying a corresponding circuit board.
Figure 3B:
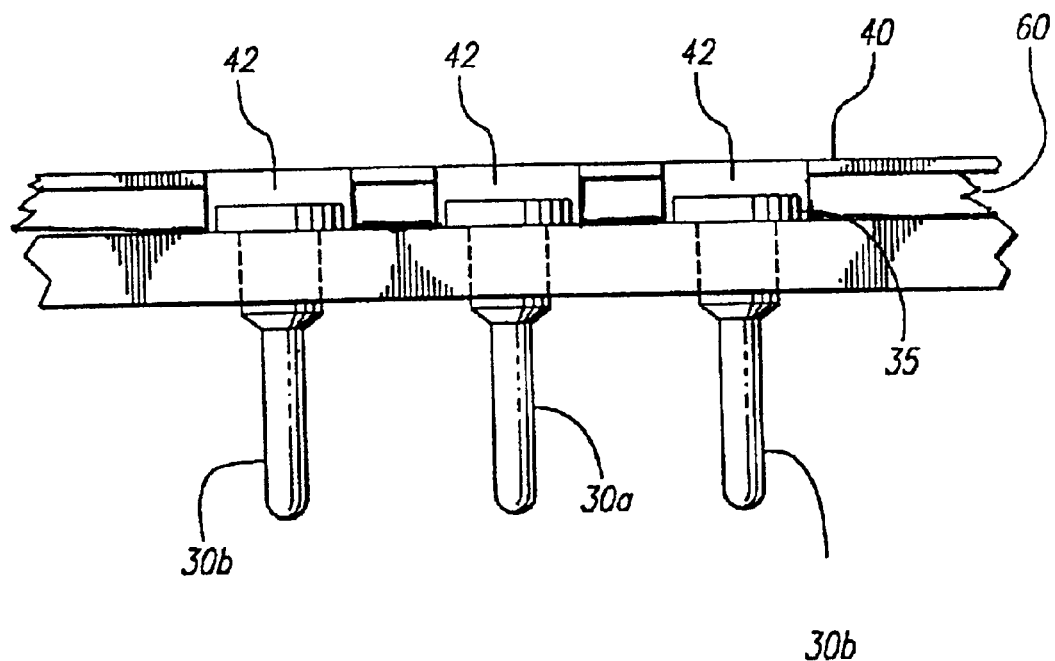
FIG. 3B depicts a side view of a solder stencil overlaying a corresponding circuit board taken along line 1—1 of FIG. 3A.

Referring now to FIGS. 3A and 3B, a solder stencil 40 is shown overlaying a circuit board 10. The stencil 10 contains apertures 41 and 42 corresponding to regions of the circuit board 10 where solder paste should be deposited. Specifically, the apertures 42 correspond to the regions in which printed circuit pins 30 are located after they are inserted in the circuit board 10. The apertures 42 allow solder paste to be applied to the heads 35 of the printed circuit pins 30. There is a thickness 60 of the solder stencil 40. The heads 35 must be thin enough that they can be accommodated in the thickness 60. That is, the heads 35 must be able to lie inside the aperture 42 of the solder stencil 40 without interfering with its functioning. For example, the head 35 may be about 0.008 inches thick and the thickness 60 may be about 0.010 inches thick.

Referring now to FIGS. 4 and 5, an embodiment of the printed circuit pin 30 of the present invention is shown. The printed circuit pin 30 has a proximal end and a distal end joined by an intermediate portion. The printed circuit pin 30 includes a shaft 31 located at the distal end of the printed circuit pin 30 and a head 35 at the proximal end. The shaft 31 and head 35 are joined by a friction segment 33 and taper region 39 which form the intermediate portion of the printed circuit pin 30. The shaft 31 has a cylindrical cross-section. The diameter and length of the shaft must be such that it may be received in the inner cavity of a socket contact. For example, the diameter may be about 0.025 inches and the length about 0.155 inches. In the embodiment shown in FIGS. 4 and 5, the friction segment 33 has a hexagonal cross-section. Alternative embodiments may use, for example, a regular polygonal cross-section with more or fewer sides. The taper region 39 may angle away from the shaft 31 at about forty-five degrees, although other tapering angles are within the scope of the invention. The portion of the printed circuit pin 30 including the taper region 39 and the friction segment 33 should have a length substantially the same as the thickness of the circuit board 10, such as about 0.055 inches. The printed circuit pin may be made of a brass alloy covered with a material with high conductivity and resistance to oxidation. For instance, the brass alloy may be covered with a nickel layer and finished with gold.

Figure 6A:
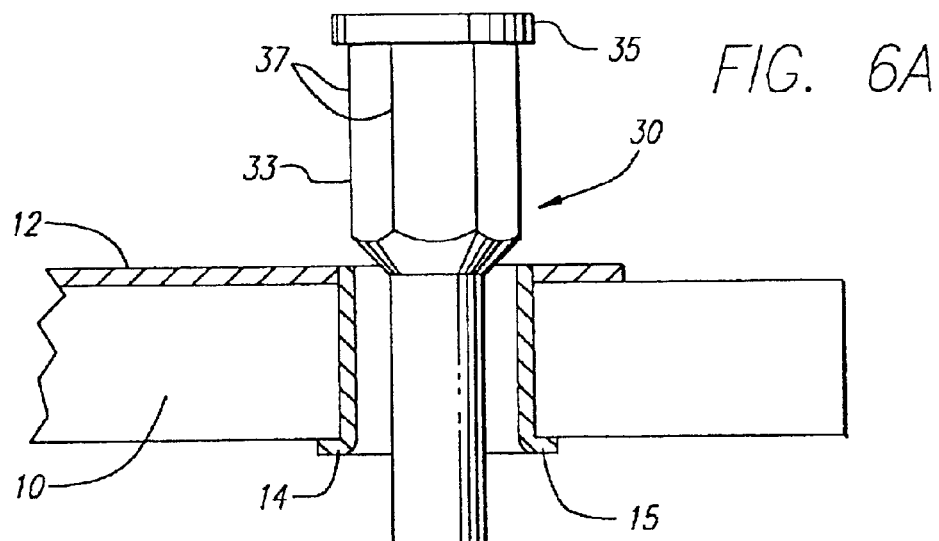
FIG. 6A depicts a side view of a printed circuit pin partially inserted in a bore through a PC board.

The construction of an interconnection will now be described with respect to FIGS. 6A–6C. Referring first to FIG. 6A, the printed circuit pin 30 is shown partially inserted through a bore 14 in the circuit board 10. The bore 14 is lined with an electrically conductive plating 15. A conductive trace 12 is in contact with the conductive plating 15. The friction segment 33 has a diameter slightly larger than the bore 14 so that it fits snugly within the bore 14, such that edges 37 of the friction segment 33 firmly contact the conductive plating 15 of the bore 14 when the printed circuit pin 30 is inserted. The contact between the edges 37 and the conductive plating 15 creates an interference fit that resists movement of the printed circuit pin 30. The head 35 is shown to have a diameter slightly larger than that of the bore 14. This dimension of the head 35 prevents the printed circuit pin 30 from being pushed completely through the bore 14 in the circuit board 10.

Figure 6B:
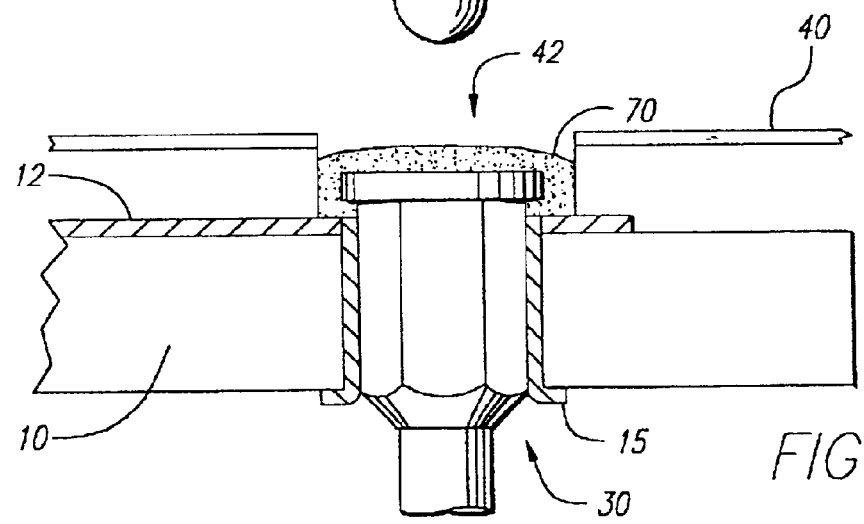
FIG. 6B depicts a side view of a printed circuit pin fully inserted in a bore through a PC board with solder paste applied to its head.
Figure 6C:
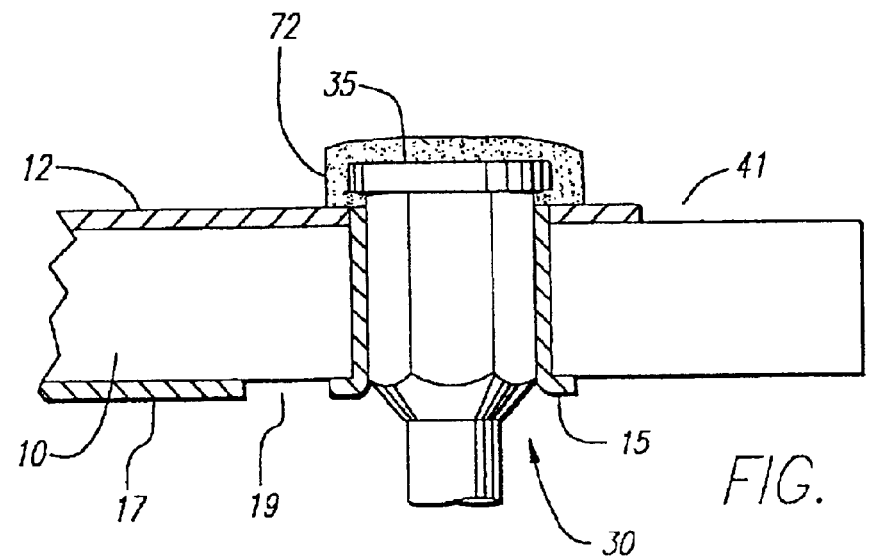
FIG. 6C depicts a side view of a printed circuit pin after solder paste applied to its head has been heated and reflowed.

FIG. 6B shows a printed circuit pin 30 that has been fully inserted in a circuit board 10. A solder stencil is positioned over the circuit board 10 so that the aperture 42 is in alignment with the head 35 of the printed circuit pin 30. Next solder paste 70 is applied to the head 35 and surrounding areas of the printed circuit pin 30 through aperture 42. The solder paste 70 is then heated causing it to melt and reflow around the head 35. Referring now to FIG. 6C, the cooled and hardened solder 72 is shown after reflow. The hardened solder 72 provides an electrically conductive path between the conductive trace 12, the conductive plating 15 and the printed circuit pin 30.

Referring now to FIGS. 7A and 7B, solder paste 53 is deposited around a bore 57 through a second circuit board 20. The bore 57 is lined with an electrically conductive plating 25. The conductive plating 25 is in electrical contact with a conductive trace 22 on the component-side surface of the circuit board 20. Next, a socket contact 50 is positioned through the bore 57 and the conductive plating 25 until a shoulder 52 of the socket contact 50 rests substantially flush with the conductive trace 22 and the conductive plating 25. The solder paste 53 is then heated causing it to melt and reflow around the shoulder 52 of the socket contact 50. After the solder paste 53 is cooled and hardened, the resulting hardened solder joint 55 provides an electrically conductive path between the conductive trace 22, the conductive plating 25, and the socket contact 50. It will be understood by one skilled in the art that the steps of inserting and soldering the printed circuit pins 30 and the inserting and soldering socket contacts 50 may be performed simultaneously or in succession.

Referring now again to FIG. 2, a side view of a completed interconnection is shown. The printed circuit pin 30 is shown extending through the first circuit board 10 down into a socket contact 50 which is dimensioned to receive the printed circuit pin 30. The socket contact 50 is disposed in a bore through the second circuit board 20.

Figure 8A:
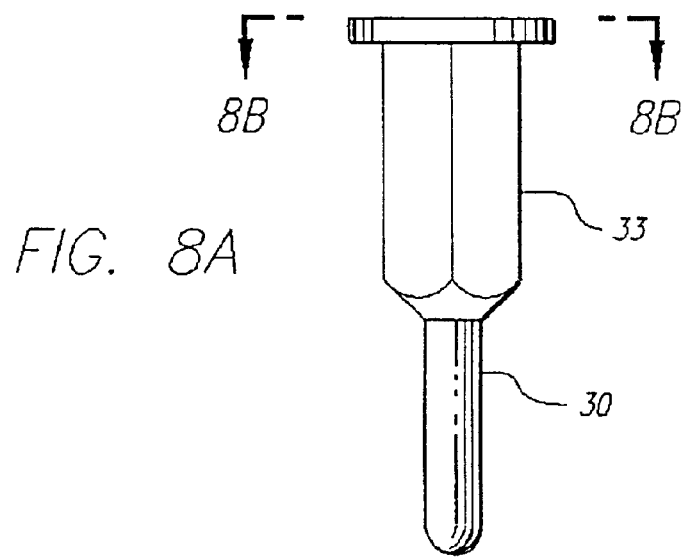
FIG. 8A depicts an alternative embodiment of a printed circuit pin which may be used in connection with the present invention.
Figure 8B:
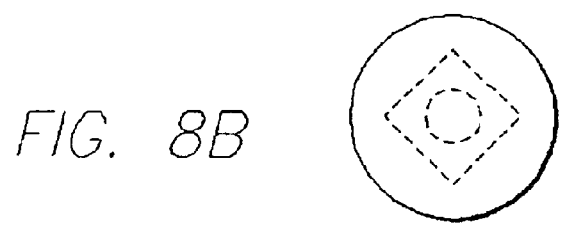
FIG. 8B depicts a view of the printed circuit pin taken along line 3—3 of FIG. 8A.
Figure 8C:
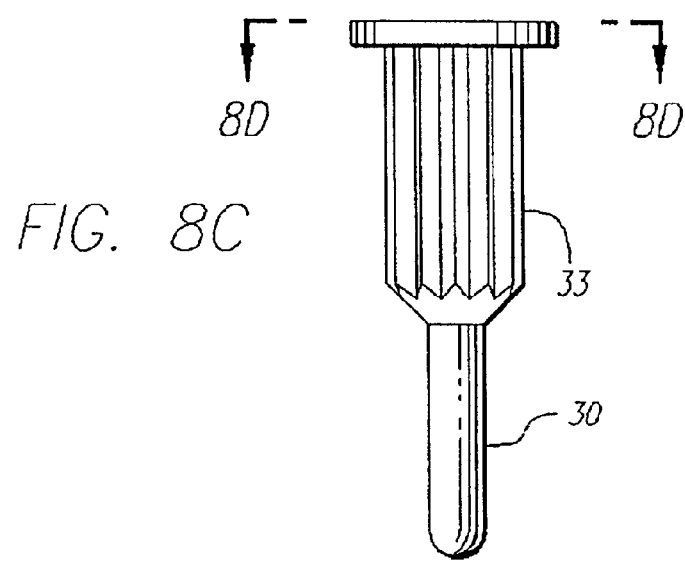
FIG. 8C depicts an alternative embodiment of a printed circuit pin which may be used in connection with the present invention.
Figure 8D:
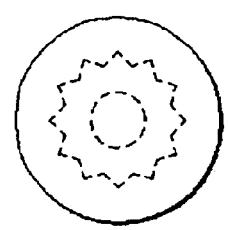
FIG. 8D depicts a view of the printed circuit pin taken along line 4—4 of FIG. 8C.

Referring now to FIGS. 8A–8D, some alternative embodiments of the printed circuit pin 30 are shown. The essential feature of the printed circuit pin 30 is that it provide an interference fit when positioned within a plated bore 14, 24. The feature may be provided by a wide variety of shapes. For example, FIGS. 8A and 8B depict a printed circuit pin 30 having a friction segment 33 that is square in cross-section. FIGS. 8C and 8D depict a printed circuit pin having a friction segment 33 that has a knurled cross-section.

A preferred method for constructing an interconnection between microstrip lines on two circuit board having just been described, it should be apparent to those skilled in the art that certain advantages of the system described herein have been achieved. While specific embodiments of the present invention have been described above, it will be apparent that obvious variations and modifications of the present invention will occur to those of ordinary skill in the art from a consideration of the foregoing description.

For example, an interconnection for microstrip applications has been illustrated, but it should be apparent that the inventive concepts described above would be equally suitable for any application requiring electrical connections between conductive traces on two different circuit boards.

Moreover, many variations in the shape of the printed circuit pin may be made within the scope of the present invention.

It is therefore desired that the present invention be limited only by the following claims.

What is claimed is:

1. A method for forming an electrical connection between radio frequency conductive traces on a first circuit board and a second circuit board having respective first and second bores therethrough, the method comprising:

vertically configuring the first and second circuit boards so that the first and second bores are generally vertically aligned;

inserting a conductive pin through both said first and second bores from the top direction, said conductive pin having a head portion with a cross section larger than the diameter of the upper of said first and second bores and having a thickness;

applying a solder stencil over the top surface of the upper circuit board, the stencil having a thickness greater than the pin head thickness and having an opening larger than the head portion of the pin and aligned over the pin;

applying solder paste to the upper surface of the solder stencil; and heating the solder paste to reflow into the stencil opening so as to contact the head portion of the pin and provide a desired radio frequency impedance electrical connection between the circuit boards.

2. The method as set out in claim 1, wherein said stencil thickness is about 0.010 inches and said pin head thickness is less than 0.010 inches.

3. The method as set out in claim 2, wherein said pin head thickness is between about 0.004 and 0.008 inches.

4. The method as set out in claim 1, wherein said step of inserting a conductive pin through said bores is performed automatically using a machine.

5. The method as set out in claim 4, wherein said pin includes a tapered region and a friction segment adjacent said head portion for frictionally engaging the bore in the upper circuit board.

* * * * *